(12) United States Patent
Resnick

(10) Patent No.: US 10,026,458 B2
(45) Date of Patent: Jul. 17, 2018

(54) MEMORIES AND METHODS FOR PERFORMING VECTOR ATOMIC MEMORY OPERATIONS WITH MASK CONTROL AND VARIABLE DATA LENGTH AND DATA UNIT SIZE

(75) Inventor: David Resnick, Boise, ID (US)

(73) Assignee: Micron Technology, Inc., Boise, ID (US)

(*) Notice: Subject to any disclaimer, the term of this patent is extended or adjusted under 35 U.S.C. 154(b) by 382 days.

(21) Appl. No.: 12/909,678

(22) Filed: Oct. 21, 2010

(65) Prior Publication Data

US 2012/0102275 A1 Apr. 26, 2012

(51) Int. Cl.
| | |
|---|---|
| G06F 9/30 | (2018.01) |
| G06F 15/78 | (2006.01) |
| G06F 15/80 | (2006.01) |
| G11C 7/10 | (2006.01) |
| G11C 7/22 | (2006.01) |

(52) U.S. Cl.
CPC .......... *G11C 7/1006* (2013.01); *G06F 9/3004* (2013.01); *G06F 15/785* (2013.01); *G06F 15/7821* (2013.01); *G06F 15/8084* (2013.01); *G11C 7/1009* (2013.01); *G11C 7/109* (2013.01); *G11C 7/22* (2013.01)

(58) Field of Classification Search
CPC .............................. G06F 15/785; G06F 9/3004
USPC .................................. 712/220, 155; 711/155
See application file for complete search history.

(56) References Cited

U.S. PATENT DOCUMENTS

| | | | |
|---|---|---|---|
| 4,787,041 A | 11/1988 | Yount | |
| 4,789,925 A * | 12/1988 | Lahti | 712/7 |
| 4,796,232 A | 1/1989 | House | 365/189 |
| 4,873,630 A * | 10/1989 | Rusterholz | G06F 9/325 712/3 |
| 4,975,878 A | 12/1990 | Boddu et al. | 365/189.07 |
| 5,067,071 A | 11/1991 | Schanin et al. | 395/275 |
| 5,163,139 A | 11/1992 | Haigh et al. | 395/375 |

(Continued)

FOREIGN PATENT DOCUMENTS

| | | |
|---|---|---|
| EP | 0718769 | 6/1996 |
| TW | 200635383 | 10/2006 |
| TW | 200729859 | 8/2007 |

OTHER PUBLICATIONS

Fang et al, Active Memory Operations, Jun. 2007, ACM, 10 pages.*

(Continued)

*Primary Examiner* — Jyoti Mehta
(74) *Attorney, Agent, or Firm* — Dorsey & Whitney LLP

(57) ABSTRACT

Memories and methods for performing an atomic memory operation are disclosed, including a memory having a memory store, operation logic, and a command decoder. Operation logic can be configured to receive data and perform operations thereon in accordance with internal control signals. A command decoder can be configured to receive command packets having at least a memory command portion in which a memory command is provided and data configuration portion in which configuration information related to data associated with a command packet is provided. The command decoder is further configured to generate a command control signal based at least in part on the memory command and further configured to generate control signal based at least in part on the configuration information.

11 Claims, 2 Drawing Sheets

(56) References Cited

U.S. PATENT DOCUMENTS

| | | | |
|---|---|---|---|
| 5,420,994 A | 5/1995 | King et al. | |
| 5,457,482 A | 10/1995 | Rhoden et al. | 345/201 |
| 5,488,583 A | 1/1996 | Ong et al. | 365/201 |
| 5,524,225 A | 6/1996 | Kranich | |
| 5,678,021 A * | 10/1997 | Pawate et al. | 711/104 |
| 5,682,344 A | 10/1997 | Seyyedy | |
| 5,737,757 A | 4/1998 | Hassoun et al. | 711/145 |
| 5,802,541 A | 9/1998 | Reed | 711/1 |
| 5,835,925 A | 11/1998 | Kessler et al. | |
| 5,907,861 A | 5/1999 | Seyyedy | |
| 5,978,915 A | 11/1999 | Lisart | |
| 6,026,478 A * | 2/2000 | Dowling | 712/24 |
| 6,049,487 A | 4/2000 | Plants et al. | 365/189.04 |
| 6,081,876 A | 6/2000 | Brewer et al. | 711/163 |
| 6,321,314 B1 | 11/2001 | Van Dyke | 711/163 |
| 6,343,346 B1 | 1/2002 | Olnowich | |
| 6,378,049 B1 | 4/2002 | Stracovsky et al. | 711/147 |
| 6,563,754 B1 | 5/2003 | Lien et al. | |
| 6,611,904 B1 | 8/2003 | Uguen | |
| 6,868,019 B2 | 3/2005 | Mohr et al. | |
| 7,174,429 B2 | 2/2007 | Revilla et al. | |
| 7,203,791 B2 | 4/2007 | Lee et al. | |
| 7,320,100 B2 | 1/2008 | Dixon et al. | 714/758 |
| 7,421,564 B1 | 9/2008 | Rahim et al. | 711/219 |
| 7,565,593 B2 | 7/2009 | Dixon et al. | 714/754 |
| 7,574,576 B2 | 8/2009 | Kato et al. | |
| 7,676,728 B2 | 3/2010 | Resnick et al. | 714/764 |
| 2003/0018860 A1 | 1/2003 | Krueger | 711/152 |
| 2003/0056143 A1 | 3/2003 | Prabhu | |
| 2003/0221091 A1 | 11/2003 | Henry et al. | |
| 2004/0093458 A1 | 5/2004 | Kanno et al. | |
| 2004/0093467 A1 | 5/2004 | Shen et al. | 711/141 |
| 2004/0193837 A1 * | 9/2004 | Devaney et al. | 712/3 |
| 2004/0202034 A1 | 10/2004 | Lee | |
| 2005/0022065 A1 | 1/2005 | Dixon et al. | 714/42 |
| 2005/0097276 A1 | 5/2005 | Lu et al. | 711/118 |
| 2005/0144375 A1 | 6/2005 | Baines | 711/105 |
| 2005/0207257 A1 | 9/2005 | Skidmore | 365/230.01 |
| 2005/0219901 A1 | 10/2005 | Gilton | |
| 2006/0047886 A1 | 3/2006 | Leaback | 711/5 |
| 2006/0190671 A1 | 8/2006 | Jeddeloh | 711/5 |
| 2006/0274577 A1 | 12/2006 | Pascucci et al. | |
| 2007/0067556 A1 | 3/2007 | Dixon et al. | 22/7 |
| 2007/0091707 A1 | 4/2007 | Hidaka | |
| 2007/0101238 A1 | 5/2007 | Resnick et al. | 714/763 |
| 2007/0113150 A1 | 5/2007 | Resnick et al. | 714/763 |
| 2007/0150671 A1 * | 6/2007 | Kurland | 711/154 |
| 2008/0155217 A1 | 6/2008 | Kato et al. | |
| 2008/0183984 A1 | 7/2008 | Beucler et al. | |
| 2008/0189557 A1 | 8/2008 | Pipitone et al. | |
| 2009/0006800 A1 | 1/2009 | Bellofatto et al. | |
| 2009/0049245 A1 | 2/2009 | Resnick | 711/118 |
| 2009/0049250 A1 | 2/2009 | Resnick | 711/147 |
| 2009/0049264 A1 | 2/2009 | Resnick | 711/163 |
| 2009/0138675 A1 | 5/2009 | Marr et al. | |
| 2009/0138680 A1 * | 5/2009 | Johnson et al. | 712/208 |
| 2009/0138687 A1 | 5/2009 | Kang | |
| 2011/0029712 A1 | 2/2011 | Resnick | 711/5 |
| 2011/0119467 A1 * | 5/2011 | Cadambi et al. | 712/27 |
| 2011/0191548 A1 | 8/2011 | Miller et al. | |
| 2012/0023294 A1 | 1/2012 | Resnick | |
| 2012/0072675 A1 * | 3/2012 | Moyer | G06F 9/3004 711/138 |
| 2013/0013876 A1 | 1/2013 | Resnick | |
| 2015/0143040 A1 | 5/2015 | Resnick | |

OTHER PUBLICATIONS

IEEE 100 The Authoritative Dictionary of IEEE Standard Terms, Dec. 2000, IEEE, Seventh edition, pp. 787-788.*
International Search Report & Written Opinion for PCT/US2011/052093, dated Feb. 23, 2012, 1-10.
Extended European search report for Appln No. 11834803.6, dated May 8, 2014.
Notice of Preliminary Rejection dated Jul. 30, 2014 received for Korean Appln No. 10-2013-7012860.
First Office Action issued by the State Intellectual Property Office for Appl. No. 201180056214.5 dated Oct. 29, 2014.
Second Office Action issue by the State Intellectual Property Office for Appl. No. 201180056214.5 dated Aug. 21, 2015, 22 pages.
Fourth Office Action received for PRC (China) Pat. Appln. No. 201180056214.5 dated Oct. 28, 2016, pp. all, 5 pages.
Third Office Action received for PRC (China) Pat. Appln. No. 201180056214.5 dated Apr. 25, 2016 (English Translation Only), 3 pages.
Second Office Action for EP Application No. 11834803.6 dated Mar. 13, 2018, pp. all.

* cited by examiner

US 10,026,458 B2

MEMORIES AND METHODS FOR PERFORMING VECTOR ATOMIC MEMORY OPERATIONS WITH MASK CONTROL AND VARIABLE DATA LENGTH AND DATA UNIT SIZE

TECHNICAL FIELD

Embodiments of the invention related generally to memories, and more specifically, in one or more of the illustrated embodiments, to memories having logic operable to provide atomic memory operations under mask control and having variable operand size.

BACKGROUND OF THE INVENTION

Memories are used in electronic systems and circuits to store data that can be retrieved for later processing, for example, by a processor. Data can be written to the memory as well as read from memory at a later time. In more advanced memories basic operations may be performed by logic in the memory itself in order to save a processor from having to issue multiple memory commands to the memory as well as manage the operation. For example, a processor may issue a single "read-modify-write" command to a memory, and the memory manages the steps of retrieving data from memory, performing operations on the data, and writing the resultant data back to memory. Thus, although one memory command is issued to the memory, the memory itself manages and performs multiple operations that involve accessing data stored in a memory and performing operations on the data. These commands may be referred to "atomic memory operations." These operations are called "atomic" because they are performed indivisibly: as a single sequence that cannot be interrupted or subdivided. If a processor has to update a shared memory item, then additional operations must be executed to prevent sharing processors from accessing and/or modifying the data item while the first processor is executing the update before returning the updated data to memory. By putting the update operation more directly in memory, shared items can be updated without coherency overhead, more quickly, and with reduced energy expenditure.

Memories and the control logic that perform atomic memory operations may not have flexibility to accommodate operations on data of different sizes. That is, the memory may be designed to perform operations on data having a certain length, and data units of a certain size. Performing operations on smaller data units (e.g., performing an operation on a byte of data although 4-bytes of data are retrieved) will consume an entire operation cycle although only the results for the smaller data unit is desired. The results from performing the operation on the other data units is discarded. Performing operations on particular data may also require multiple operations due to the fact that the desired data may be stored in an manner that requires multiple different blocks of data to be retrieved and the operation using data from different blocks cannot be performed in a single simple sequence or efficiently.

Therefore, it is desirable to have a memory capable of performing atomic memory operations that also provides flexibility in operand and data size independently from how particular memory operations are implemented.

DETAILED DESCRIPTION

Embodiments of the invention may provide capability so that multiple atomic operations can be done at the same time with a single command. Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
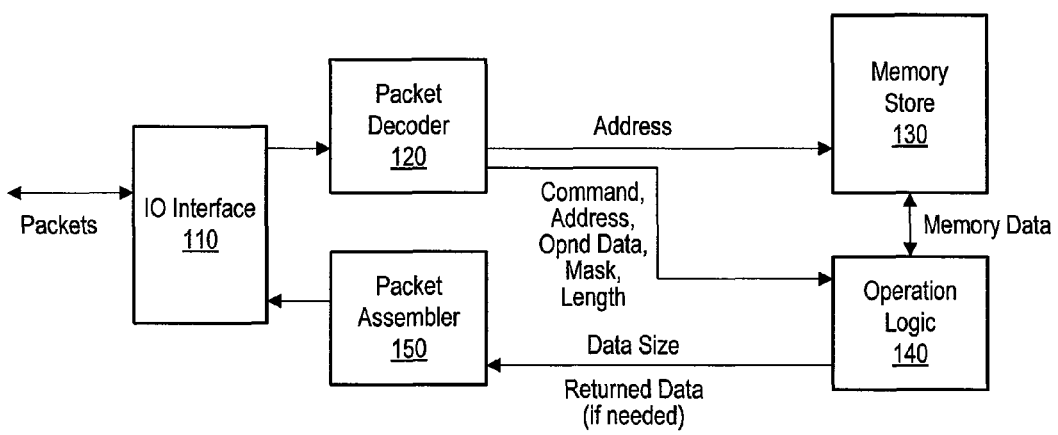
FIG. 1 is a block diagram of a memory according to an embodiment of the invention.

FIG. 1 illustrates a portion of a memory 100 according to an embodiment of the invention. The memory 100 includes an IO interface 110 that receives memory commands, as well as other information, such as configuration information related to data associated with the memory command, to request execution of the memory command. The memory commands and configuration information may be provided to the IO interface 110 in a packetized format. That is, a command packet may include fields in which the combination of binary digits (bits) in the fields represent information that can be decoded by a command decoder, such as a packet decoder 120, to determine what command to execute, and in some embodiments, configuration information related to data associated with the command packet. Examples of command packets including configuration information related to the data will be explained in more detail below.

The packet decoder 120 receives packets from the IO interface 110 and decodes the packet to generate internal control and timing signals to carry out requested memory commands. For example, in the embodiment of FIG. 1, the packet decoder 120 decodes a packet to generate internal signals representing command, address, operand data, mask information, length information, and data unit size information. Address information is provided to memory store 130 that is configured to store data to identify memory locations that may be accessed during execution of the command. The memory store 130 may be implemented using various different technologies, for example, memory cell technologies such as dynamic random access memory cells, static random access memory cells, as well as non-volatile memory cells, and disk technologies such as magnetic drive media.

The memory 100 further includes operation logic 140 that performs memory operations, such as read and write operations, as well as other operations that can be part of an atomic memory operation. The operation logic 140 is controlled by the internal control and timing signals (e.g., command, address, operand data, and mask, data length, and data unit size information) provided by the packet decoder 120. As will be described in more detail below, control of the operation logic 140 is based at least in part on the information received in the memory packet. In some embodiments, the operation logic 140 performs various operations, for example, logic operations, arithmetic operations, comparison operations on operand data. The operand data may be data provided to the memory 100 associated with control, function and data in separate signals or with a command packet; memory data stored in the memory store 130 retrieved in response to a command in the command packet; or combinations thereof. In the event data is to be returned in response to a command packet, a packet assembler 150 in the memory 100 receives data from the operation logic 140 and prepares the data to be provided through the IO interface 110, for example, in a return data packet. Data, in some embodiments, can be returned directly. The data may be the result of operations performed by the operation logic 140, data retrieved from memory store 130, or some other data.

In some embodiments of the invention, the blocks illustrated in FIG. 1 represent memory store interface circuitry that is coupled to communicate with a memory store that represents a plurality of memories that may be operated independently from one another. For example, the memory store may be implemented in an embodiment by stacking a plurality of memory devices all in communication with blocks 110, 120, 130, 140, and 150.

The memory 100 may perform conventional memory operations, for example, reading data from and writing data to a location in memory store 130 as identified by a memory address. The memory 100 is further operable to perform atomic memory operations. As previously discussed, atomic memory operations are memory operations that appear indivisible by the entity issuing the memory command, but includes several internal memory operations, for example, multiple memory store access operations. Although one atomic memory command is issued to the memory, the memory internally performs several internal memory operations to complete the requested memory operation. For example, the IO interface 110 receives command packets and the packet decoder 120 decodes a memory command for an atomic memory operation. In response, the packet decoder 120 generates internal control and timing signals to manage the multiple internal memory operations (e.g., signals representing command, address, operand data, and mask, data length, and data unit size information).

An example of an atomic memory operation is a memory operation that includes reading data from a memory location, performing an arithmetic operation with an operand provided to the memory and the read data, and writing the result back to the memory location from which the data was initially read. In some embodiments of the invention, the atomic memory operation has two versions of operations: one version that performs the requested memory operation and writes the result back to the original memory location and another version that performs the requested memory operation, and in addition to writing the result back to the original memory location, the result is provided as an output from the memory. Other examples of atomic memory operations will be described below.

Figure 2:
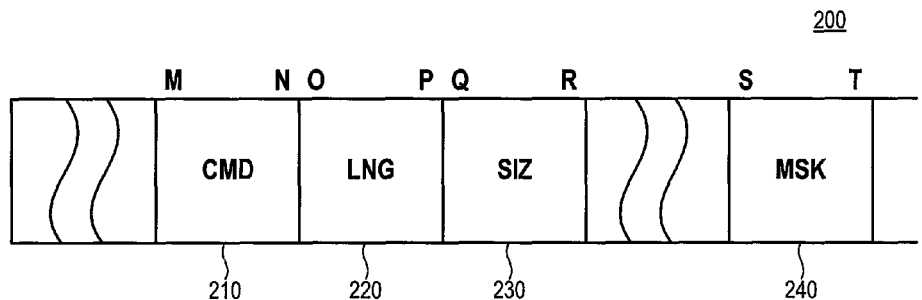
FIG. 2 is a diagrammatic representation of a portion of a command packet according to an embodiment of the invention.

FIG. 2 illustrates various portions of a command packet 200 according to an embodiment of the present invention. A command portion of the packet 200 may include a command field 210, while a configuration portion of the packet 200 may include, for example, a data length field 220, a data unit size field 230 and/or a mask field 240. The command packet 200 mays be provided to a memory, for example, memory 100 of FIG. 1, to request a memory command to be performed, as previously discussed, The command packet 200 may include other portions that are well known, or later developed, in addition to those specifically shown in FIG. 2, The fields specifically identified in FIG. 2, however, will be described in detail herein. It will be appreciated that although specific examples of fields and field sizes are described below, the invention is not limited to such and, for example, the field sizes may be variable and may be larger or smaller without departing from the scope of the invention. The command packet 200 includes a command field (CMD) 210. The CMD field 210 is used to provide a command that is decoded by the command decoder to perform an operation. In the embodiment illustrated in FIG. 2, the CMD field 210 is [(N−M)+1] bits in length. In some embodiments, the CMD field 210 is 6 bits long. The command packet 200 further includes a data length field (LNG) 220 that is used to specify a total length of data (not shown) for data associated with the command packet. In the specific embodiment illustrated in FIG. 2, the LNG field 210 is [(P−O)+1] bits in length. In some embodiments, the LNG field is 5 bits long. The value defined by the LNG field 210 may correspond to a code representing the total length of data. For example, the following definitions may be used in an embodiment of the invention:

| LNG | Total Operand Size |
| --- | --- |
| 0 | 0 Bytes |
| 1 | 8 Bytes |
| 2 | 16 Bytes |

Thus, a value of 1 in the LNG field 220 defines the total data length of the packet to be 8-bytes long. Where a memory command defined by the CMD field 210 does not require data, a value of 0 may be provided in the LNG field 220 to indicate that no data is associated with the packet.

The command packet 200 further includes a data unit size field (SIZ) 230. In the embodiment illustrated in FIG. 2, the SIZ field 230 is [(R−Q)+1] bits in length. In an embodiment of the invention, the SIZ field 230 is 3 bits long. The value included in the SIZ field 230 defines, for example, the size of each data unit in terms of a number of bytes. For example, the following definitions may be used in an embodiment of the invention:

| SIZ | Data Unit |
| --- | --- |
| 1 | 1 Byte |
| 2 | 2 Bytes |
| 3 | 4 Bytes |
| 4 | 8 Bytes |
| 5 | 16 Bytes |

Thus, a value of 3 in the SIZ field 230 defines the data unit size to be 4-bytes long. That is, each unit of data included with the packet is 4-bytes in length.

The command packet 200 further includes a mask field (MSK) 240. In the embodiment illustrated in FIG. 2, the MSK field 240 is [(T−S)+1]bits in length. In an embodiment of the invention, the MSK field 240 is 16 bits long. The bit combination in the MSK field 240 is used to define which of the data units in the packet are masked, In some embodiments, a "1" in a bit location of the MSK. field 240 indicates that the corresponding data unit should be masked and a "0" in a bit location of the MSK field 240 indicates that he corresponding data unit should not be masked. A value of "1" in the mask field prevents the operation defined in the command field from taking place on a respective data unit, a "0" value allows the operation to take place on the respective data unit.

The LNG, SIZ and MSK fields 220, 230, 240 individually and together provide configuration information related to the data that is operated on by the memory command provided in the CMD field 210. The following non-limiting example will be used to illustrate the interaction of the definitions of the fields 220, 230, 240.

Assume for an example command packet that the value in the LNG field 220 is 2 to define a total data length of 16 bytes, and the value in the SIZ field 230 is 1 to define the size of the data unit to be 1 byte. As a result, with a total data length of 16 bytes and a data unit size of 1 byte, the example packet includes 16 units of data. Assuming that a bit combination of the MSK field 240 is: (MSB) 1010 1010 1010 1010 (LSB), the 16 data units provided as data are masked such that the first data unit is not masked (the first mask bit is a "0") and the second data unit is masked (the second mask bit is a "1"). Every other data unit of the remaining data units (i.e bytes 3-16) is masked (i.e., bytes 4, 6, 8, 10, 12, 14, and 16) and the rest of the data units are not masked (i.e., bytes 3, 5, 7, 9, 11, 13, and 15). If the indicated command is an addition then each unmasked data byte adds a corresponding data item to the memory data byte before rewriting the unmasked data bytes back to memory. Memory data bytes that are masked are unmodified.

In another example, bits of the MASK field 240 starting with the LSB correspond to a respective data unit as defined by the SIZ field 230. For example, assume an example command packet having a value of 2 for the LNG field 220 to define a total data length of 16 bytes, and the value in the SIZ field 230 is 2 to define the data unit size to be 2 bytes. As a result, with a total data length of 16 bytes and a data unit size of 2 bytes, the example packet includes 8 data units of data. Assuming that a bit combination of the MSK field 240 is: (MSB) 1111 1111 0110 0110 (LSB), the 8 data units provided as data are masked such that the first, fourth, fifth, and eighth data units are not masked and the second, third, sixth and seventh data units are masked. The most significant 8 bits of the MSK value are "1", but because the number of data units for the example packet is eight, only the least significant 8 bits of the MSK value are used for the masking operation. Although particular examples have been described, other arrangements of configuration information related to the data can be used without departing from the present invention.

Figure 3:
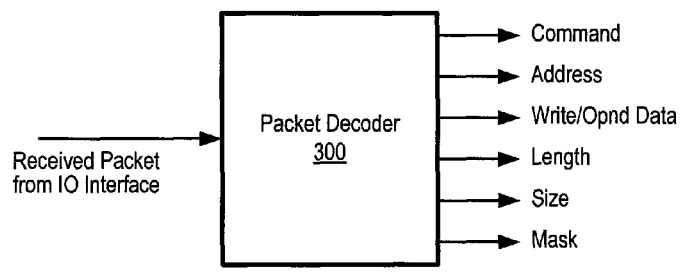
FIG. 3 is a block diagram of a packet decoder according to an embodiment of the invention.

FIG. 3 illustrates a packet decoder 300 according to an embodiment of the invention. The packet decoder 300 may be used as the packet decoder 120 of memory 100 of FIG. 1. The packet decoder 300 receives a command packet from an IO interface (e.g., IO interface 110) that includes, among other things, a memory command and configuration information, for example, information related to total data length, data unit size, and mask information. In some embodiments, the packet decoder 300 receives the command packet 200 of FIG. 2.

The packet decoder 300 receives information related to the data associated with the command packet, for example, the information provided by the LNG, SIZ and MSK fields of the command packet 200. The packet decoder 300 decodes the values in the various fields and generates internal signals representing the command, address, operand data and data length, data unit size, and mask information from the packet. As will be described in more detail below, the decoded information may be used to carry out operations on data associated with the command packet.

Figure 4:
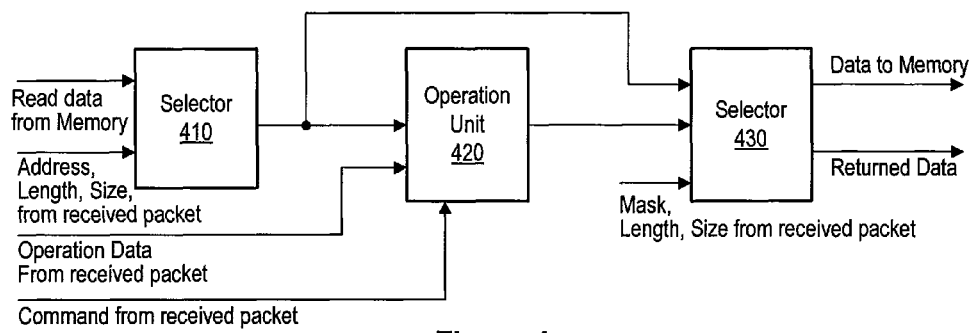
FIG. 4 is a block diagram of a portion of operation logic according to an embodiment of the invention.

FIG. 4 illustrates an operation logic 400 in accordance with an embodiment of the invention. The operation logic 400 may be used for the operation logic 140 of the memory 100 of FIG. 1. The operation logic 400 includes a first selector 410 that is configured to receive read data from memory store and to further receive address, data length, and data unit size information associated with a command packet. The first selector 410 provides the read data to an operation unit 420 and a second selector 430. The first selector 410 configures the data according to the address, data length, and data unit size information to be provided to the operation unit 420. For example, select portions of the data as identified by the information are provided to the operation unit 420. The configured data is also provided to a second selector 430 as well. The operation unit 420 further receives operand data and the command associated with the command packet and performs various operations on the read data and/or operand data according to the command. Example operations will be described in more detail below.

Resultant data from the operation unit 420 is provided to the second selector 430. The second selector uses mask, data length, and data unit size information associated with the command packet to provide data to return to the requesting device and/or to store in the memory store (where such data could be the read data, the resultant data, or some combination or portion of either of the foregoing). The data may be provided to the memory store and/or prepared to be returned through an IO interface (e.g., IO interface 110, FIG. 1). In some embodiments, which data is provided by the second selector 430 is based at least in part on information from the command packet. For example, if a mask bit is "0" the second selector 430 provides a corresponding portion of the resultant data whereas for a "1" a corresponding portion of the read data is provided. In some embodiments different data is returned to a requesting processor than is stored in the memory store based at least in part on how the atomic operation is defined.

In the embodiment shown in FIG. 4, the operation unit 420 is operable to perform arithmetic operations. For example, in an embodiment of the invention the operation unit 420 is operable to perform arithmetic operations on two 32-bit values. The operation unit 420 may be operable to perform logic operations on the data. For example, in an embodiment of the invention, the operation unit 420 is operable to perform logic operations on a 64-bit value.

In an embodiment of the invention, the operation unit 420 is operable to perform the following arithmetic operations.

| Name | Function |
| --- | --- |
| INC | Add 1 to memory field(s) |
| DEC | Subtract 1 from memory field(s) |
| ADD | Add operand(s) to memory field(s) |
| SUB | Subtract operand(s) from memory field(s) |

In an embodiment of the invention, the operation unit 420 is operable to perform the following logic operations.

| Name | Function |
| --- | --- |
| CB | Clear bits/AND |
| SB | Set bits/OR |
| TB | Toggle bits/XOR |

The operation unit may perform other logic operations as well. For example, compare logic operations such as swap and store operations, as well as others may be performed. Compare logic operations compares two values and makes a determination as to which of the two values is greater or lesser (or, in some embodiments, if the two values are equal). With compare and swap logic operations, the greater or lesser value may be selected to be stored.

As previously described, in operation, address, LNG, and SIZ values are used by the first selector 410 to configure read data for operation by the operation unit 420. For example, assuming that the operation unit 420 can perform operations on up to two 32-bit data items, the operation unit 420 can be used to perform operations as 4×1 byte, 2×2 byte, or 1×4 byte operation logic. That is, where the data unit size is 1 byte, two sets of 4×1 byte operands can be operated on by the operation unit 420. In another example, where the data unit size is 4 bytes, two sets of 1×4 byte data operands can be operated on by the operation unit 420.

As further previously described, the MSK value can be used to mask or not mask data units of data associated with a packet, the data units defined by the SIZ value. In operation, the MSK and SIZ values may be used to select particular data units of the data to be provided by the second selector 430. For example, in applying the MSK value, data units of the data can be selectively provided by the second selector 430. This operation may be illustrated by considering a previously described example. In a previously described example, it was assumed that the total data length of 16 bytes and the size of the data unit to be 1 byte, resulting in an example packet having associated data that includes 16 data units of data. The example MSK value did not mask the first and every other byte long data unit but masked the second and every other byte long data unit. As applied to the selection of particular data units, the 16 byte-long units of data the first, third, fifth, seventh, ninth, eleventh, thirteenth, and fifteenth data units, that is, eight of the possible 16 byte-long data units are provided by the second selector 430.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory, comprising:
    a command decoder configured to receive command packets, each of the command packets having at least a memory command portion in which a memory command is provided and a configuration portion in which configuration information related to data associated with a respective command packet is provided, the command decoder further configured to generate a command control signal based at least in part on a respective memory command and further configured to generate a configuration control signal based at least in part on a respective configuration information; and
    operation logic configured to receive read data from a memory store, wherein the read data is associated with the respective command packet, and configured to further receive an operand from the respective command packet, and to perform an atomic operation on the read data and the operand in accordance with the command control signal and the configuration control signal, the operation logic comprising:
        a first selector circuit configured to configure the read data in accordance with the configuration control signal and provide the configured read data to an operation circuit;
        the operation circuit configured to receive the configured read data and the operand, and to perform the atomic operation on the configured read data and the operand in accordance with the command control signal to generate a resultant; and
        a second selector circuit configured to receive the configured read data from the first selector circuit and the resultant from the operation circuit and configured to forward first data to a packet assembler for forwarding on to a component external to the memory, and wherein the second selector circuit is further configured to forward second data to the memory store, wherein the first data is a first combination of portions of the resultant and portions of the read data, wherein the second data is a second combination of portions of the resultant and portions of the read data determined based on the respective configuration information, and wherein the first data is different than the second data.

2. The memory of claim 1 wherein the command decoder comprises:
    a packet decoder configured to receive command packets that include at least mask control information as the respective configuration information, wherein the second selector circuit determines what portions of the configured read data are not masked based on the mask control information.

3. The memory of claim 2 wherein the packet decoder is configured to receive 16-bits of the mask control information.

4. The memory of claim 1 wherein the command decoder comprises:
    a packet decoder configured to receive command packets that include at least data length information defining at least in part a length for the data associated with a respective command packet.

5. The memory of claim 4 wherein the command decoder is configured to receive the data length information defining the length for the data as one of 0 bytes, 8 bytes, or 16 bytes.

6. The memory of claim 1 wherein the command decoder comprises:
    a packet decoder configured to receive command packets that include at least data unit size information defining at least in part a size of a data unit of the data associated with the respective command packet.

7. The memory of claim 6 wherein the command decoder is configured to receive data unit size information defining the size of the data unit of the data associated with the respective command packet in terms of bytes.

8. The memory of claim 7 wherein the command decoder is configured to receive data unit size information defining data unit sizes of zero bytes, 1 byte, 2 bytes, 4 bytes, 8 bytes, or 16 bytes.

9. The memory of claim 1 wherein the command decoder comprises:
    a command decoder configured to receive and decode the memory command and configured to manage multiple internal operations to execute the memory command.

10. The memory of claim 1 wherein the operation logic is configured to perform operations on received data under mask control based at least in part on the configuration control signal provided by the command decoder.

11. The memory of claim 10 wherein the configuration control signal comprises configuration control signals and wherein the command decoder is configured to generate the configuration control signals based at least in part on data length, data unit size, and data mask information.

* * * * *